United States Patent
Makino et al.

(10) Patent No.: US 7,063,129 B2
(45) Date of Patent: Jun. 20, 2006

(54) HEAT TRANSPORT DEVICE AND ELECTRONIC APPARATUS

(75) Inventors: Takuya Makino, Kanagawa (JP); Takashi Mochizuki, Kanagawa (JP); Kazuhito Hori, Kanagawa (JP); Kazuyoshi Kiga, Kanagawa (JP); Noriaki Sakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 154 days.

(21) Appl. No.: 10/720,154

(22) Filed: Nov. 25, 2003

(65) Prior Publication Data

US 2005/0051303 A1 Mar. 10, 2005

(30) Foreign Application Priority Data

Dec. 12, 2002 (JP) ............................. 2002-361022

(51) Int. Cl.
 *F28D 15/00* (2006.01)
 *F28F 7/00* (2006.01)

(52) U.S. Cl. .......................... 165/104.26; 165/104.21; 361/700

(58) Field of Classification Search ........... 165/104.26, 165/104.33, 104.21, 185; 361/700; 257/715, 257/433
See application file for complete search history.

(56) References Cited

U.S. PATENT DOCUMENTS

| 4,246,597 | A | * | 1/1981 | Cole et al. .................. 257/713 |
| 5,725,049 | A | * | 3/1998 | Swanson et al. ........ 165/104.26 |
| 5,933,323 | A | * | 8/1999 | Bhatia et al. ................ 361/700 |
| 6,158,502 | A | * | 12/2000 | Thomas .................. 165/104.26 |
| 6,164,368 | A | * | 12/2000 | Furukawa et al. ...... 165/104.33 |
| 6,167,948 | B1 | * | 1/2001 | Thomas .................. 165/104.26 |
| 6,474,074 | B1 | * | 11/2002 | Ghoshal ....................... 62/3.7 |
| 6,889,756 | B1 | * | 5/2005 | Hou ....................... 165/104.33 |
| 2002/0157813 | A1 | * | 10/2002 | Cho et al. .............. 165/104.26 |
| 2005/0051303 | A1 | | 3/2005 | Makino et al. |

OTHER PUBLICATIONS

U.S. Appl. No. 11/043,132, filed Jan. 27, 2005, Makino et al.
U.S. Appl. No. 10/720,154, filed Nov.25, 2003, Makino et al.
U.S. Appl. No. 10/724,838, filed Dec. 2, 2003, Makino et al.

* cited by examiner

*Primary Examiner*—Tho Duong
(74) *Attorney, Agent, or Firm*—Oblon, Spivak, McClelland, Maier & Neustadt, P.C.

(57) ABSTRACT

A heat transport device has an evaporator and a condenser connected through a vapor phase channel and a liquid phase channel and has wicks of the condenser arranged symmetrically around an axis orthogonal to the direction of gravity. The flow of fluid in a liquid phase inside the wicks is not disrupted even when the heat transport device is tilted at any angle relative to the horizontal surface or the vertical surface.

5 Claims, 9 Drawing Sheets

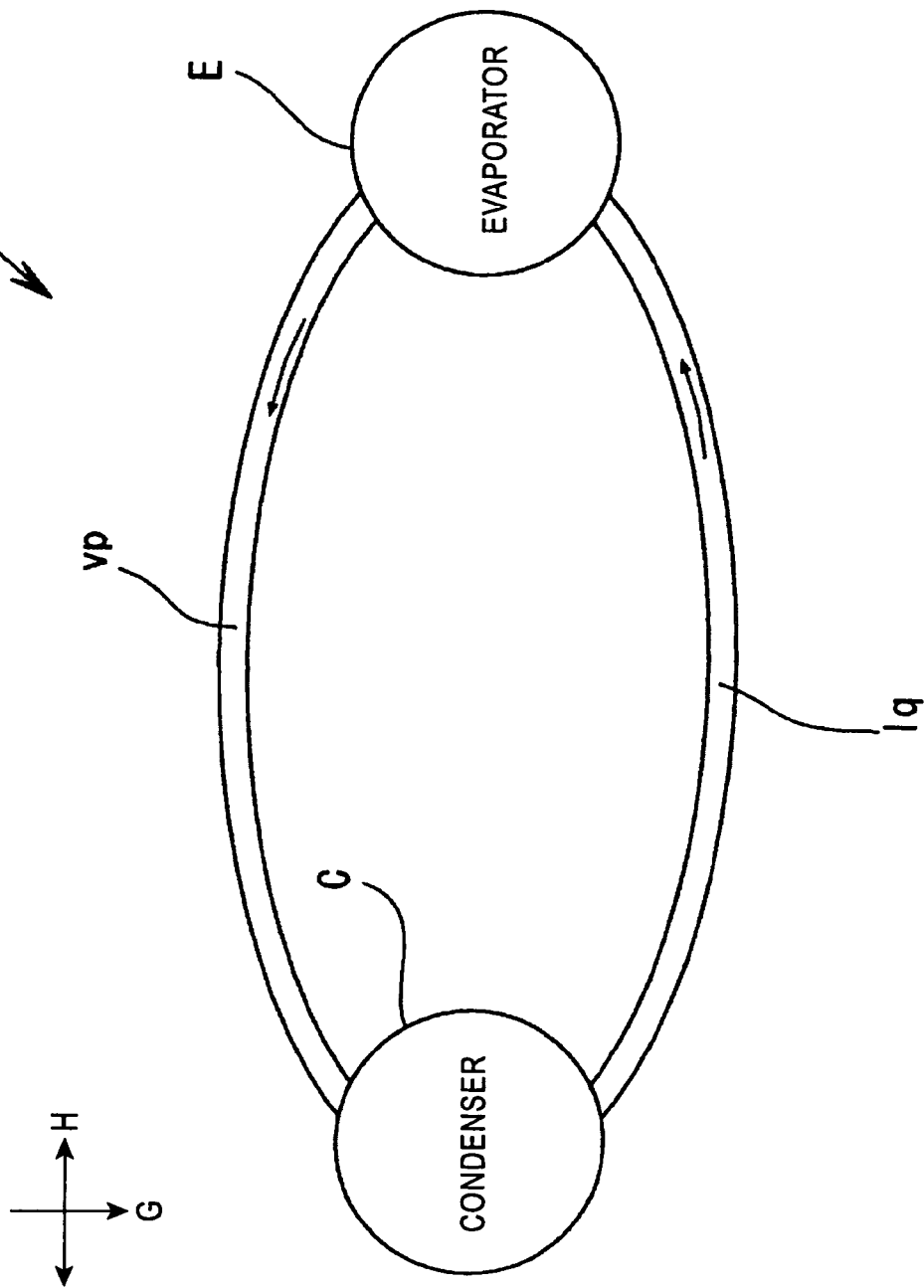

HEAT TRANSPORT DEVICE AND ELECTRONIC APPARATUS

BACKGROUND OF THE INVENTION

1. Field of the Invention

The present invention relates to a heat transport device having an evaporator and a condenser and an electronic apparatus having the heat transport device. The present invention relates to heat transport technology that applies, for example, capillary pumped loops (CPL), which is a subject in the field of fluid micro-electro-mechanical systems (fluid MEMS). The heat transport device is suitable for reducing the size and thickness of the device and apparatus.

2. Description of the Related Art

For heat dissipation and cooling, typically, a heat pump is used. The heat pump has an air-tight container containing fluid. A wick, which is used for maintaining and refluxing the fluid, is installed inside the container. However, this type of heat pump has problems such as the following: it requires a large space; it is not suitable for downsizing; and its efficiency is reduced because fluid exists in both gas and liquid phases and, thus, the pipes bend. In addition, since the performance of this type of heat pump strongly depends on the distance and angle the fluid travels, the range of application for such a heat pump is restricted.

The recent development in technologies for electronic devices and micro-machines enable the production of even smaller devices. Among the technologies, the so-called MEMS technology, which applies a semi-conductor production process, has drawn attention. Research on applying the MEMS technology to heat transport devices has been carried out. The reasons for the research are the need for a heat source cooling system suitable for small and advanced electronic devices and the need for efficiently radiating heat generated by electronic devices, whose performance have recently dramatically improved.

In areas concerning MEMS, a structure utilizing capillary pumped loops (CPL) draws heat from a subject by undergoing repeated cycles of vaporizing a refrigerant at an evaporator and liquefying the evaporated refrigerant at a condenser (refer to Non-patent Document 1).

In a gas-liquid separation type heat pump having an evaporator and a condenser, heat is transported as described in the following.

(1) The fluid in a liquid phase transported from the condenser reaches the evaporator via a liquid phase channel and then is evaporated at the evaporator by receiving heat from the outside.

(2) The evaporated fluid moves, at high speed, through the vapor phase channel towards the condenser. Then the evaporated fluid returns to liquid by releasing heat to the outside at the condenser.

(3) The heat transport sequence described in (1) and (2) is repeated inside sealed piping.

[Non-Patent Document 1]

Jeffrey Kirshberg, Dorian Liepmann, Kirk L. Yerkes, "Micro-Cooler for Chip-Level Temperature Control," Aerospace Power Systems Conference Proceedings, (USA), Society of Automotive Engineers, Inc., Apr. 1999, P-341, pp. 233–238.

SUMMARY OF THE INVENTION

A known heat pump having a device, which applies the abovementioned CPL principle, may ease restrictions on the distance and angle the fluid travels in comparison with known heat piping. There are remaining problems concerning the heat pump in that its performance still depends on its angle of orientation relative to the direction of gravity.

When designing an apparatus or a portable device such as a camera, it must be taken into consideration that the orientation of the apparatus constantly changes during use. In other words, if the condenser and the other parts that make up the heat transport device installed inside the apparatus function satisfactorily only in a particular angle relative to the direction of gravity, the flow of the fluid will be disrupted when the heat transport device is oriented in an angle unintended by the design. As a result, the efficiency of heat dissipation and cooling might be reduced.

For known heat transport devices, however, not enough attention has been paid or no effective means have been provided for reducing the angular dependency of the device relative to gravity. (For example, the currently provided means get in the way of reducing the size and thickness of the device).

An object of the present invention is to provide a heat transport device having small angular dependency relative to the direction of gravity and having a structure suitable for reducing the size and thickness.

According to a first aspect of the present invention, a heat transport device includes an evaporator for vaporizing fluid in a liquid phase; a condenser having a plurality of wicks for generating capillary force for refluxing fluid; a liquid phase channel for circulating the fluid in a liquid phase wherein the liquid phase channel connects with both the evaporator and the condenser; a vapor phase channel for circulating the fluid in a vapor phase wherein the vapor phase channel connects with the evaporator and the condenser; and wherein the plurality of wicks formed on the condenser are arranged symmetrically around an axis orthogonal to the direction of gravity.

Even if the heat transport device is tilted at a given angle, the degree of bias of fluid in the wicks is reduced. As a result, the harmful effects caused by the angular dependency of the device relative to the direction of gravity may be prevented.

Preferably, the fluid reaching the condenser via the vapor phase channel passes through and liquefies at a plurality of grooves formed on the wicks of the condenser. The fluid is collected in one place and then supplied to the evaporator.

The liquefied fluid, which passed through the grooves on the wicks of the condenser, is collected in one place so that it is not easily affected by the orientation of the device.

Preferably, the plurality of grooves on the wicks of the condenser is arranged in a radial pattern centered at a joint of the liquid phase channel and the condenser.

The grooves are formed in a radial pattern as viewed from the horizontal direction. In this way, the flow of the fluid relative to the direction of gravity will not be limited to a particular direction.

Preferably, the plurality of wicks is symmetrically arranged on a horizontal surface parallel to the axis.

The fluid can be condensed at the wicks in a perpendicular direction. As a result, efficiency and safety of the device is improved.

Preferably, the liquid phase channel and the vapor phase channel are composed of flexible material.

By structuring the liquid phase channel and the vapor phase channel with flexible material (piping), harmful effects caused by unnecessary stress may be prevented.

Preferably, the evaporator is in thermal contact with an imaging element and the condenser is disposed on a case of an imaging apparatus.

According to a second aspect of the present invention, an electronic apparatus includes an evaporator for evaporating fluid in a liquid phase; a condenser having a plurality of wicks for generating capillary force for refluxing fluid; and a heat transport mechanism having a liquid phase channel circulating the fluid in a liquid phase wherein the liquid phase channel is connected to both the evaporator and the condenser and a vapor phase channel circulating the fluid in a vapor phase wherein the vapor phase channel is connected to both the evaporator and the condenser, the liquid phase channel and the vapor phase channel are for radiating heat of or cooling a data processing element; wherein the plurality of wicks of the condenser is symmetrically arranged around an axis orthogonal to the direction of gravity; and wherein the evaporator is in thermal contact with the data processing element.

Even when the orientation of the heat transport device disposed on an electronic apparatus such as an imaging apparatus is dramatically changed, reduction in the heat transport efficiency and performance of the heat transport device is prevented, the influence on the performance of data processing elements, such as imaging elements, is reduced, and thermal noise affecting the data processing elements is reduced.

BRIEF DESCRIPTION OF THE DRAWINGS

FIG. 1 is a schematic view of the basic composition of the present invention;

FIG. 3 is a schematic view partially showing the interior of the apparatus;

FIG. 5 shows an evaporator and a condenser;

FIG. 7 is a drawing viewed from the direction orthogonal to the substrate composing the condenser;

DESCRIPTION OF THE PREFERRED EMBODIMENTS

Figure 2A:
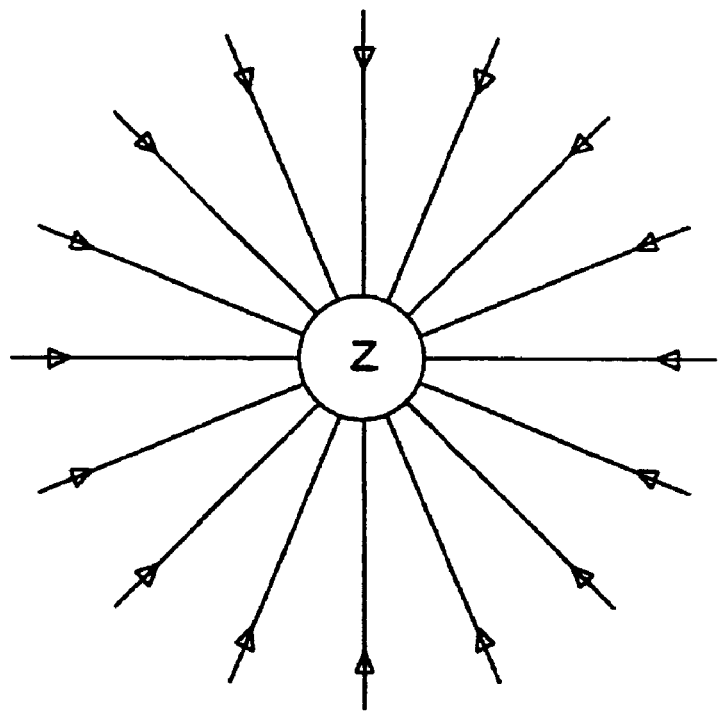
FIGS. 2A and 2B are explanatory views of the structures of the grooves on a wick.

The present invention relates to a heat transport device, which applies the CPL principle, or to an electronic apparatus having functions for radiating heat and/or cooling. The present invention can effectively improve the efficiency of the device without getting in the way of, for example, reducing the size and thickness of the device. In particular, when the present invention is applied to a heat radiating and cooling systems for various electronic apparatuses, the effect is particularly great for portable devices and imaging apparatuses, whose orientation constantly changes during use. Here, the term 'heat transport apparatus,' in a narrow sense, refers to a device for transmitting heat emitted from a heating source with fluid. In a wide sense, however, the term refers to entire devices or systems, such as heat sources, means for cooling, means for radiating heat, or temperature controls.

FIG. 1 is a schematic view showing the basic composition of a heat transport device according to the present invention.

The heat transport device has an evaporator E, where fluid in a liquid phase is evaporated, and a condenser C, where fluid in a vapor phase is condensed. The drawings show one evaporator E and one condenser C for convenience. When applying the present invention, however, the number of evaporators and condensers are not limited to one each. Thus, various embodiments of the present invention are preferably accepted wherein one condenser and a plurality of evaporators or one evaporator and a plurality of condensers are used.

The heat transport device has two types of channels for connecting the evaporator E and the condenser C: a liquid phase channel lq for circulating the fluid in a liquid phase and a vapor phase channel vp for circulating the fluid in a vapor phase. (The drawing shows one of each type of channels).

The fluid in a liquid phase, such as water, moves from the condenser C to the evaporator E via the liquid phase channel lq. The fluid in a vapor phase moves from the evaporator E to the condenser C via the vapor phase channel vp.

The evaporator E and the condenser C have a structure for generating capillary force for refluxing the fluid, which, in other words, is a wick. The wick may be a groove, a mesh, a plurality of wires, or a sintered metal piece. The embodiment described in the following has groove-shaped wicks.

For the fluid, typically, the following may be used: water, ethanol, methanol, propanol (including its isomers), ethyl ether, ethylene glycol, Fluorinert, or ammonia. A refrigerant having a boiling point that satisfies the design of the heat transport device and desired properties such as antibacterial properties may be selected.

A heat source or a heater of an electronic apparatus is connected to the evaporator E, and means for cooling or radiating heat is connected to the condenser C. In this way, the fluid in a liquid phase reaches the evaporator E via the liquid phase channel lq. At the evaporator E, the fluid is evaporated by receiving heat from the heat source. Then the fluid in a vapor phase moves to the condenser C via the vapor phase channel vp. At the condenser C, the fluid releases heat and returns to liquid, completing the liquid and vapor phases cycle. A transport pump may be installed in the midstream of the channel to increase the amount of fluid transported. If it is necessary to receive energy as a driving force of the pump from anything besides heat from the heating element, electricity may be consumed by the transport pump.

As described above, when the device is not necessarily maintained in a particular orientation during use, a wick designed to be used only in a particular angle and/or direction relative to gravity is insufficient. Specifically, when the structure of the condenser C, where the liquid is retained, is heavily dependant on a particular angle relative to the direction of gravity, the flow of the fluid is disrupted. For example, if arrow G indicates the direction of gravity and a double-headed arrow H indicates the horizontal direction, as in the drawing, the fluid of the condenser C flows in the direction of gravity and the grooves on the wick of the condenser C is formed along the direction of arrow G. The flow of the fluid when the device is not tilted relative to the direction of arrow G clearly differs from the flow when the device is greatly tilted relative to the direction of arrow G. This is because the structure of the wick becomes asymmetrical when the wick is tiled or rotated on the vertical surface. Typically, the device is designed so that when it is tilted 90° from the direction of arrow G in the direction of arrow H the flow of the fluid will not stop and, thus, the worst incident, i.e. malfunctioning of the device, will not occur.

Accordingly, the present invention provides a wick for the condenser that is axially symmetrical or substantially axially symmetrical to the axis orthogonal to the direction of gravity (i.e. has rotational symmetry around the horizontal axis) so that the condenser does not acquire a particular directionality.

The fluid reaches the condenser C via the vapor phase channel and then flows through the plurality of grooves formed on the wick, where it is liquefied. If the fluid flows through one of the grooves formed around the abovementioned axis when the orientation of the device changes and then is collected in one area before being sent through the liquid phase channel, a flow path of the fluid that is not affected by the change in the orientation of the device may be provided.

Figure 2B:
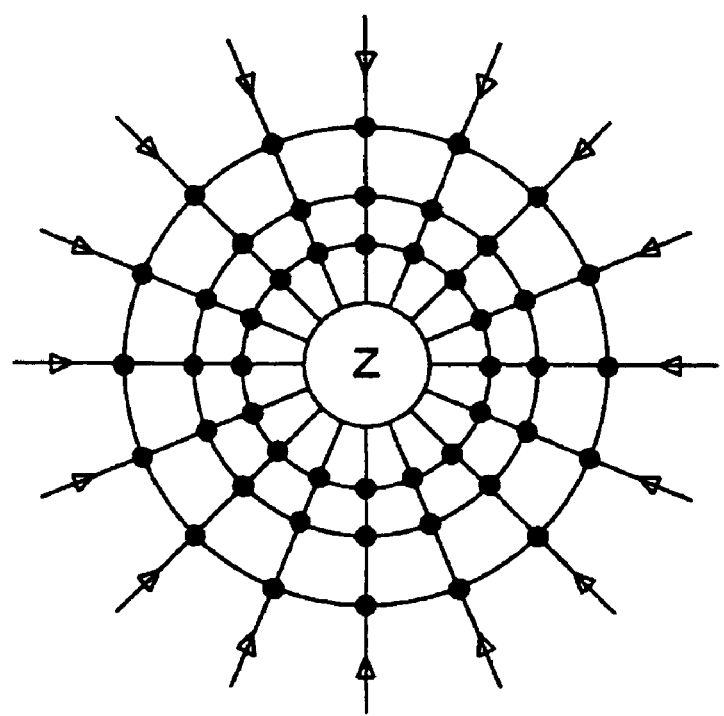

FIGS. 2A and 2B are schematic views showing the structures of the grooves on the wick.

FIG. 2A shows an embodiment of a plurality of grooves on the wick arranged in a radial pattern, wherein the character Z indicates an area in the center of the radial pattern. The axis that passes through area Z and that is perpendicular to the page corresponds to the abovementioned axis, which is orthogonal to the direction of gravity. Area Z is an area connecting the condenser and the liquid phase channel. (In other words, the fluid is concentrated in the direction towards area Z.)

FIG. 2B shows the grooves in a spider-web-like structure, wherein concentrically arranged grooves centered on area Z are added to the grooves shown in FIG. 2A. The dots shown in the drawing indicate the intersecting points of the grooves arranged in a radial pattern and the grooves arranged in circles, which are where each of the grooves communicate with each other. In this embodiment, the fluid is collected towards area Z via the grooves arranged in a radial pattern or the grooves arranged in circles.

Another embodiment may have spiral grooves with area Z as the center of the spiral or may have, in addition to spiral grooves, grooves in a radial pattern, or else may have fine irregularities symmetrically arranged and centered on area Z. In other words, the flow of the fluid should not have a particular directionality relative to the direction of gravity. This is also the same when the structure of the device is extended in the third dimension. The only three-dimensional structure, however, not having a particular directionality is a sphere. A sphere has the smallest surface area among all three-dimensional structures with the same volume and, thus, has the smallest heat radiating surface. Accordingly, it is clear that directionality is not the only factor that determines the shape of the device.

For liquid phase channel lq and vapor phase channel vp, it is desirable to install heat insulation means to inhibit heat exchange between the outside and the channels, including the liquid phase and vapor phase channels. More specifically, by preventing the fluid flowing inside the liquid phase and vapor phase channels from undergoing a phase change, the fluid can stably flow through the channels, and, as a result, high heat transport efficiency is acquired. Moreover, the diameter and the cross-sectional area of the channels may be constant or may be gradually changed along the channels.

FIGS. 3 to 9 show the composition of an imaging apparatus including an electronic apparatus 1 according to the present invention, having a heat transport mechanism for a data processing element (including computing devices, image processing devices, and imaging devices).

Figure 3:
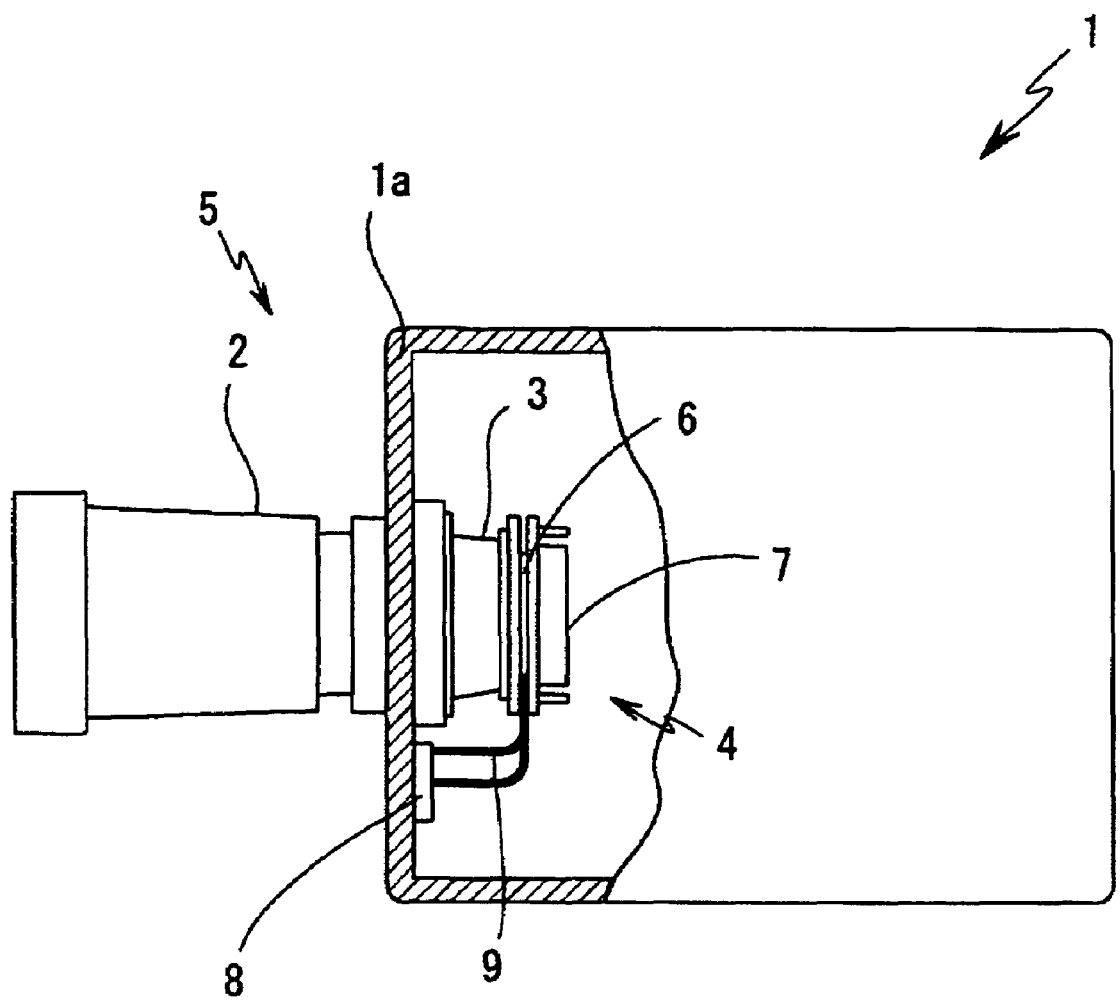
FIG. 3, along with FIGS. 4 to 9, shows an embodiment of an imaging apparatus according to the present invention.

FIG. 3 is a schematic view partially showing the interior of the apparatus viewed from the vertical direction. Inside a case 1a of the electronic apparatus 1, having a lens portion 2 and an optic block 3, a heat transport device 4 is installed.

An imaging means (or an imaging system) 5 has a lens portion 2, including an objective lens and a lens body tube, and an optic block 3 installed inside the case 1a of the apparatus. On an imaging portion 6 of the optic block 3, an imaging element (e.g. a solid imaging element) is disposed. For example, area image sensors such as charge coupled device (CCD) type, MOS type, or CMOS type sensors may be used.

The heat transport device 4 is installed to cool the solid imaging element and is suitable for reducing the size of the device by applying MEMS technology. The heat transport device 4 typically has an evaporator 7 and a condenser 8 wherein the evaporator 7 attached to the imaging portion 6 is in thermal contact with the imaging element and wherein the condenser 8 is installed on the inner surface of the case (e.g. a front panel) away from the optic block 3. In other words, heat from the condenser 8 is radiated to the case so that it does not thermally affect the optic block 3. The evaporator 7 and the condenser 8 are typically connected by connecting means 9, 9, . . . (piping made of flexible material) forming the vapor phase channel and the liquid phase channel.

Figure 4:
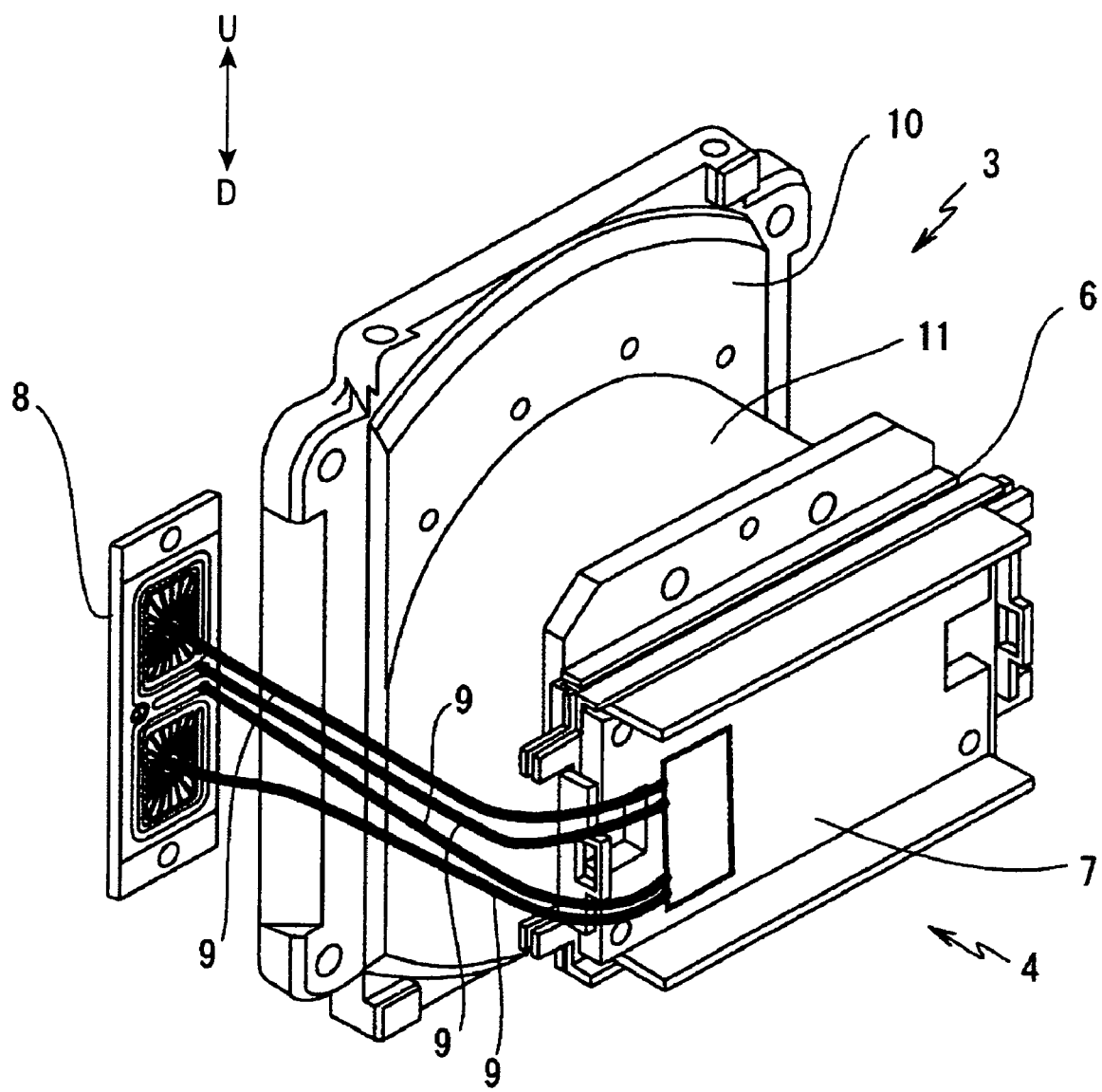
FIG. 4 shows an embodiment of a heat transport device installed on an optical block.

FIG. 4 shows a schematic view of the structure of the heat transport device disposed on the optic block. The arrow in the drawing indicates the vertical direction wherein character U indicates the upper direction and character D indicates the lower direction. (This is also the same for FIGS. 5, 7 and 9 in the following).

The optic block 3 has an attaching portion 10, which attaches to the case 1a, and a tube 11. On the rear edge of the tube 11 (the edge opposite to attaching portion 10), the imaging portion 6 is mounted.

The evaporator 7 of the heat transport device 4 is a thin rectangular plate. The evaporator 7 is installed to the imaging portion 6 with joining means such as screws so that the longitudinal direction of the evaporator 7 is arranged in the horizontal direction. The condenser 8 is installed with joining means such as screws on the case 1a beside the optic block 3.

For the connecting means 9 connecting the evaporator 7 and the condenser 8, piping such as tubes or pipes is used.

In this embodiment, there is one evaporator 7 and one condenser 8, and the condenser is disposed beside the optic block 3. The arrangement, however, is not limited to this, and a plurality of condensers may be mounted on predetermined positions around the attaching portion 10 of the optic block 3.

Figure 5:
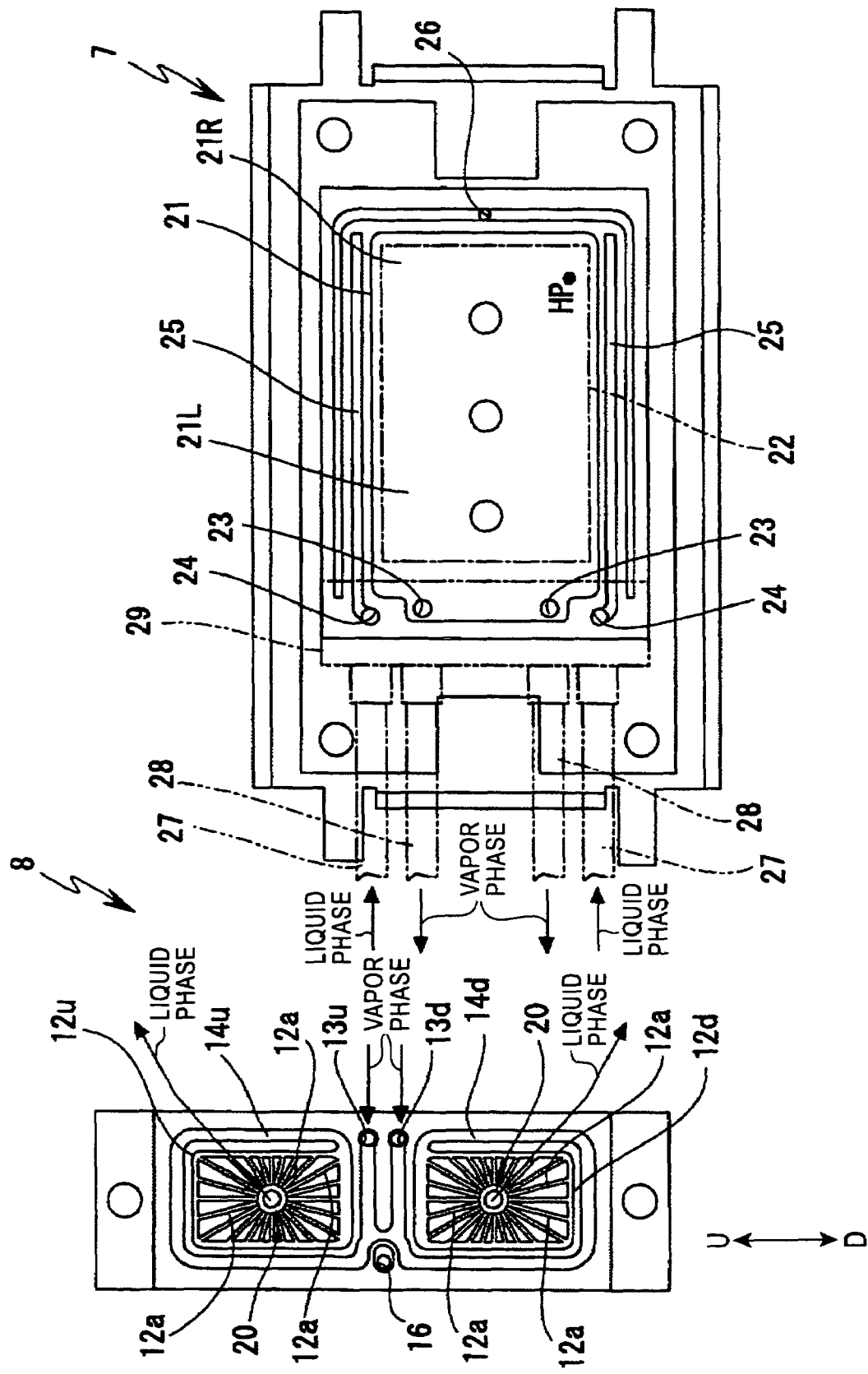
FIG. 5, along with FIGS. 6 to 9, shows an embodiment of a heat transport device.
Figure 6:
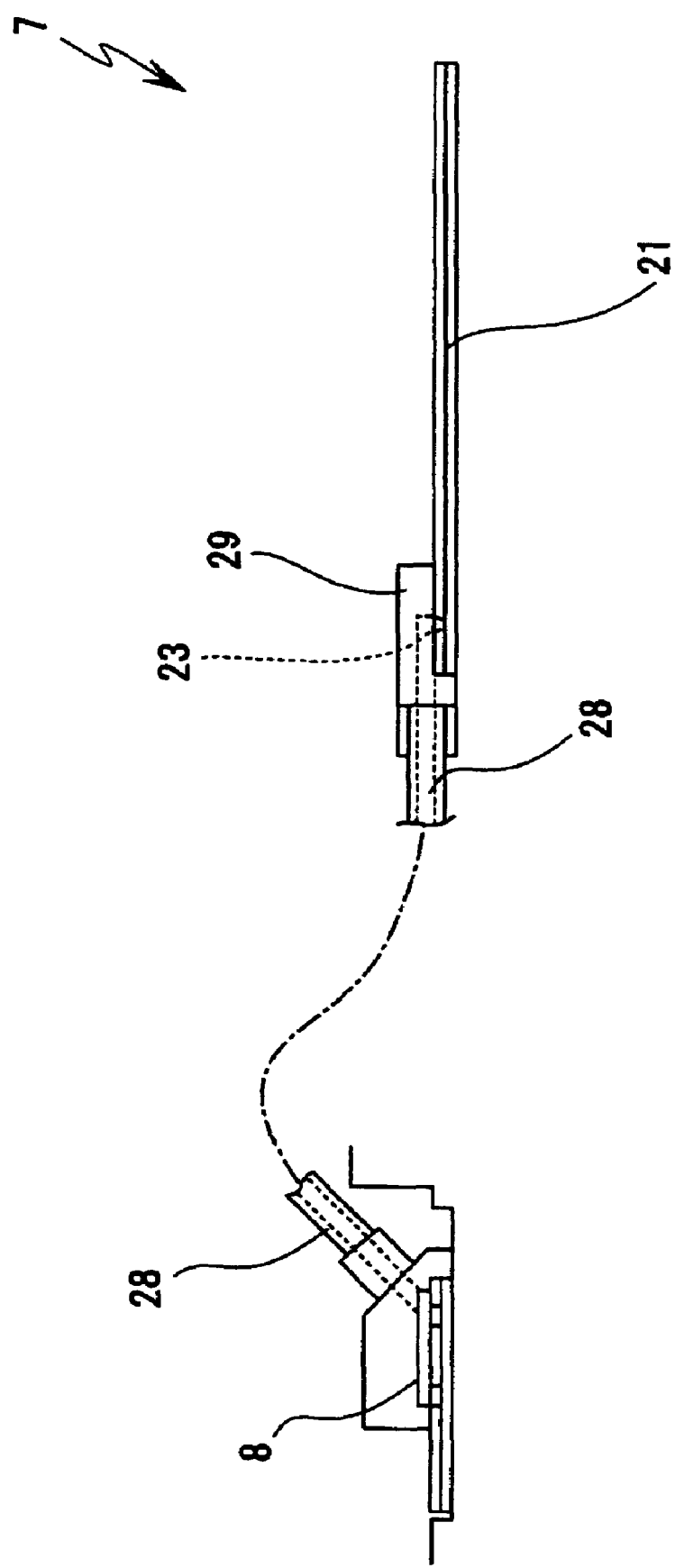
FIG. 6 shows the connection between the evaporator and the condenser.
Figure 7:
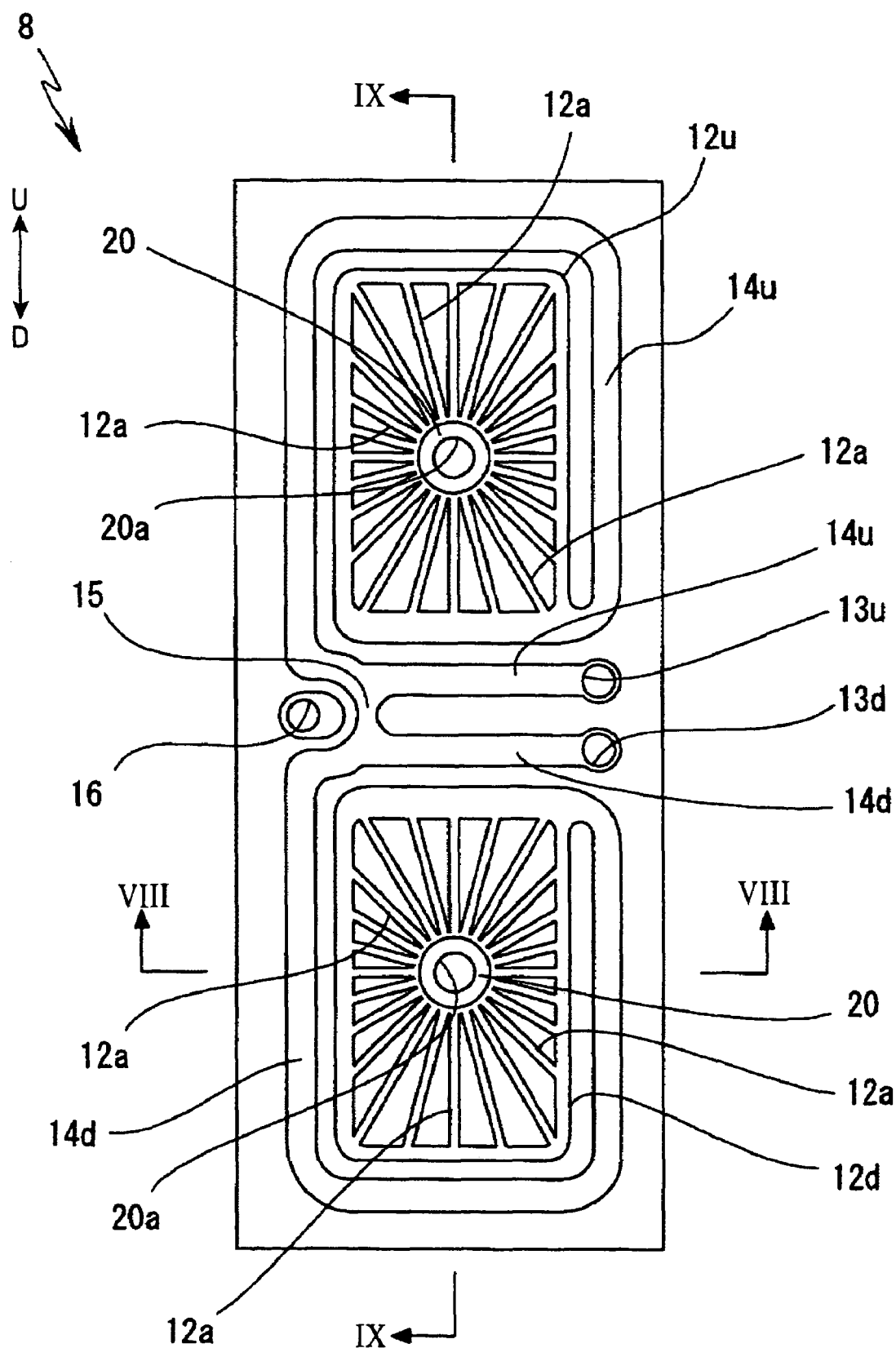
FIG. 7, along with FIGS. 8 and 9, show a substantial part of the condenser.
Figure 8:
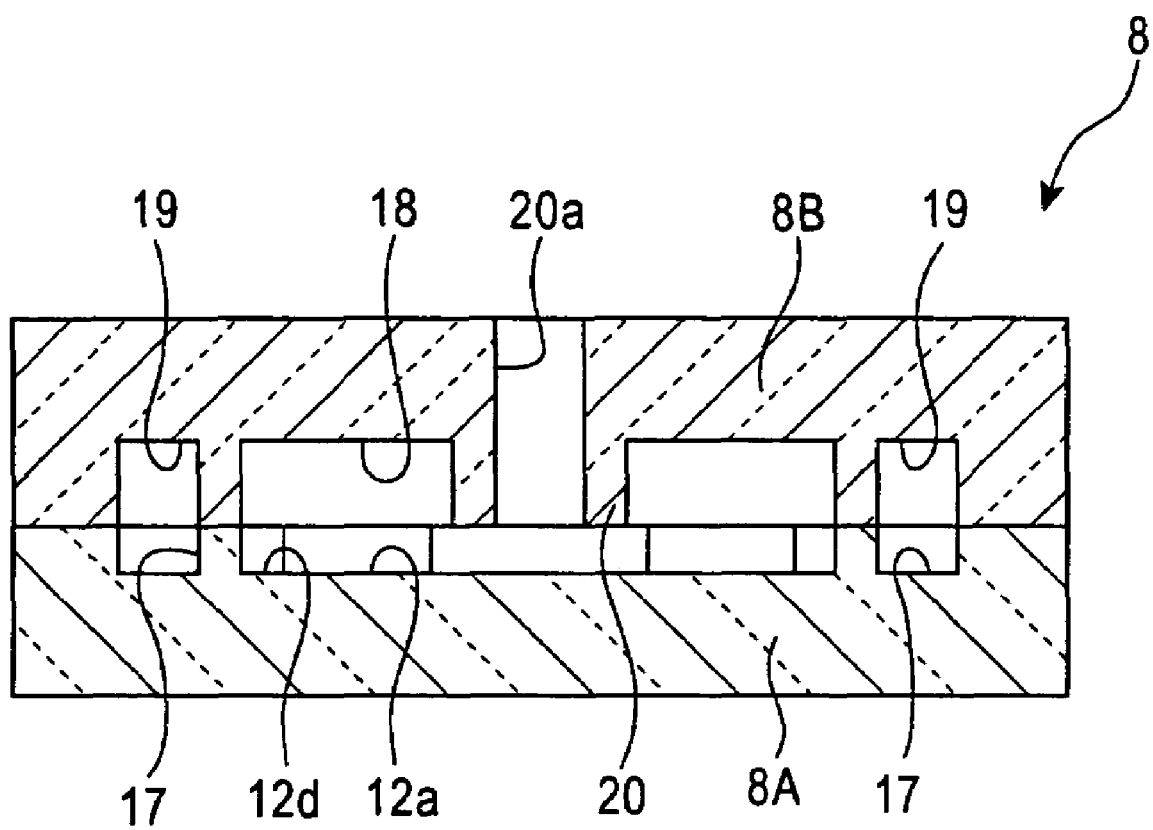
FIG. 8 is a cross-sectional view taken along line VIII—VIII in FIG. 7.
Figure 9:
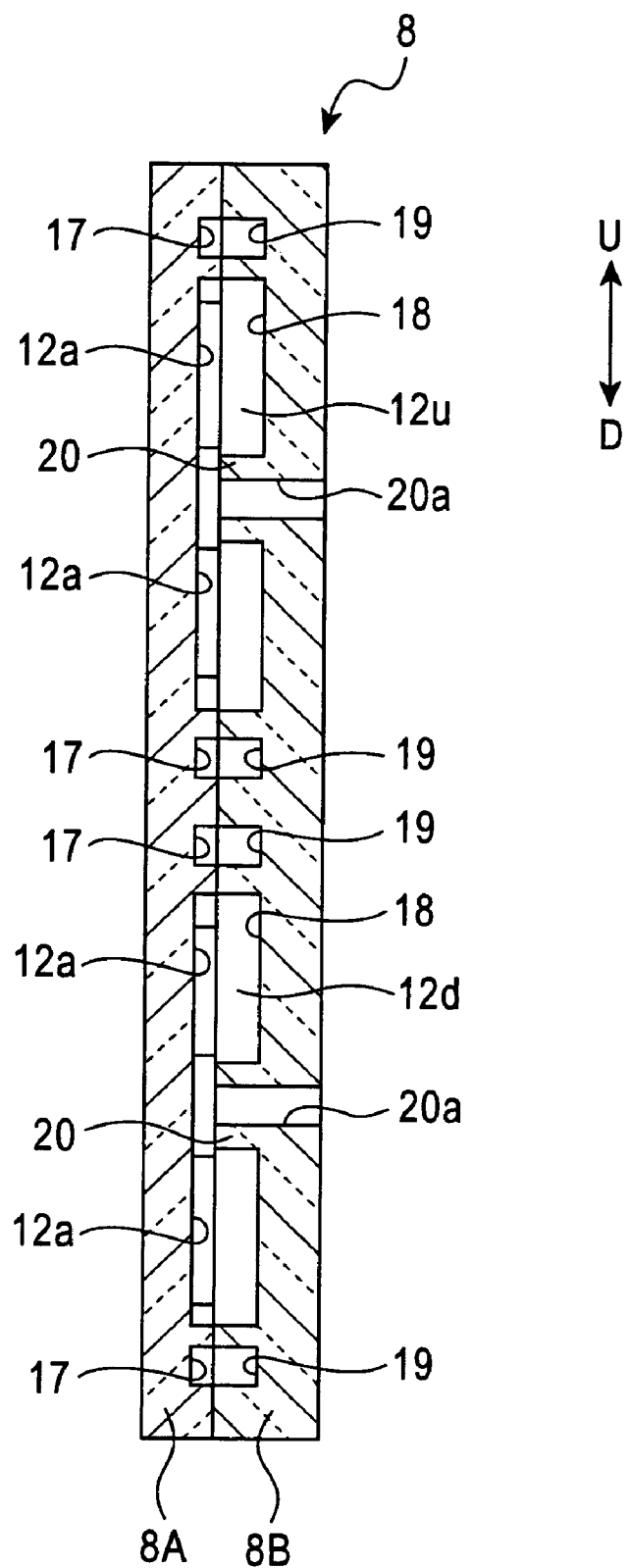
FIG. 9 is a cross-sectional view taken along line IX—IX in FIG. 7.

FIGS. 5 to 9 show an embodiment of the heat transport device 4. FIG. 5 shows the evaporator and the condenser viewed from a direction along the optical axis of the imaging system. FIG. 6 shows the evaporator and the condenser viewed along the vertical direction. FIG. 7 shows a substantial part of the condenser (the part except the portion attached to the case). FIG. 8 is a cross-sectional (horizontal sectional) view taken along line VIII—VIII. FIG. 9 is a cross-sectional (vertical sectional) view taken along line IX—IX.

First, the condenser 8 is described in the following.

In this embodiment, as shown in FIGS. 5 and 7, a plurality of wicks 12u and 12d have a combination of grooves in a radial pattern and spiral channel. Each of the wicks 12u and 12d are symmetrical to each other on the horizontal surface.

Each wick has a plurality of grooves 12a, 12a, . . . and is structured so that each wick does not have angular dependency relative to the direction of gravity.

In two locations between wicks 12u and 12d, there are inlets 13u and 13d of the vapor phase channel. From these inlets, the fluid in a vapor phase reaches each groove 12a of the wicks 12u and 12d via each channel. More specifically, the channels are structured by two symmetrical channels 14u and 14d, which are formed around the spiral grooves 12a, 12a, . . . of each of the wicks. For example, the fluid in a vapor phase that enters the upper inlet 13u does not directly flow into the groove 12a but flows through the channel 14u in a clockwise direction making almost a full circuit around the wick 12u before reaching each groove 12a of the wick 12u. Similarly, the fluid in a vapor phase that enters the lower inlet 13d flows through the channel 14d in a counterclockwise direction making almost a full circuit around the wick 12d before reaching each groove 12a of the wick 12d.

The channels 14u and 14d communicate with each other slightly before the first corners from the inlet 13u and 13d. Therefore, the fluid entering from one of the inlets is separated in two directions at a bifurcation 15 towards channel 14u or 14d. Consequently, even if one of the wicks malfunctions for some reason, the fluid will flow into the other wick operating normally. Near the bifurcation 15, there is an inlet 16 wherein the fluid is supplied to the condenser under a reduced pressure atmosphere.

As shown in FIGS. 8 and 9, the condenser 8 is composed of two substrates joined together.

Typically, the condenser 8 may be composed of a first substrate 8A made of silicon and a second substrate 8B made of glass wherein both the first and second substrates are integrated by anodic bonding.

On the first substrate 8A, there are the grooves 12a, 12a, . . . of the wicks 12u and 12d and the grooves 17 forming the channels 14u and 14d, having predetermined depths. The material of the substrate is not limited to silicon and may be metal such as copper, aluminum, nickel, gold, silver, or platinum, or may be electrically conductive polymers or ceramics, whose heat conductivity is equivalent to metal. The grooves of the wicks and the channels are formed by applying, for example, sandblasting, dry etching (RIE), wet etching, ultraviolet light (UV) etching, laser etching, proton light etching, electron beam etching, or micromolding. Each groove 12a of the wicks 12u and 12d has a constant width. The width of the grooves, however, may be gradually changed along the direction the flow of the fluid.

The second substrate 2B has concaves 18 forming the wicks 12u and 12d and grooves 19 forming the channels 14u and 14d. The joints 20, which are connected to the liquid phase channel and forms outlets of the channels, are formed on each of the wicks 12u and 12d. Each joint protrudes to the side of the first substrate 8A. This is for narrowing the gap between the cylindrical joints 20 and the protrusion on the substrate-8A-side (the portion between the neighboring grooves 12a) around the joints 20 so that the flow of the fluid in a liquid phase is not disrupted.

Each joint 20 is disposed in the center of the wick. The plurality of grooves 12a is disposed in a radial pattern centered on the central axis of a through-hole 20a in the joint 20. The external diameter of the joint 20 is larger compared to the groove pitch of the wick around the tip of the joint so that the fluid in a liquid phase will flow smoothly.

If the material used for the second substrate 8B has high heat conductivity, thermal diffusion of the substrate may have a negative effect on the heat transport efficiency. Therefore, glass or synthetic resin such as polyimide, polytetrafluoroethylene, or polydimethylsiloxane (PDMS) is used. The concaves and grooves on the substrate are formed by, for example, sandblasting, dry etching (RIE), wet etching, ultraviolet light (UV) etching, laser etching, proton light etching, electron beam etching, or micromolding.

To manufacture the condenser 8, concaves and grooves are formed on one side of the second substrate 8B by sandblasting. On one side of the first substrate 8A, grooves and channels of the wicks are formed by dry etching and sandblasting. Then, after surface processing is performed as required, the processed surfaces of each of the substrates are aligned and bonded together by anodic bonding, resin bonding, pressure bonding such as thermo compression, or weld bonding such as laser welding. As the condenser 8 and the evaporator 7 are connected with tubes, fluid is supplied under a reduced pressure atmosphere via the inlet 16 (or inlet 26 mentioned in the following). Then each inlet is closed.

Next, the evaporator 7 is described in the following.

As shown in FIG. 5, the evaporator 7 has a wick 21, which is in thermal contact with the imaging element 22. (In the drawing, the imaging element 22 is schematically shown as a dashed-line rectangle. In the drawing, the element is disposed on the back side of the page.) The heat generated by the imaging element 22 evaporates the fluid. The dot indicated by characters HP is the heat concentration point of the imaging element 22 and is located on the lower right corner away from the center (because the signal reader becomes especially hot).

The wick 21, which is rectangular when viewed from the direction of the optic axis of the imaging element 22, has two outlets. More specifically, as shown in FIG. 5, there are two outlets 23 formed on the left edge of the wick 21 in a longitudinal direction with a predetermined spacing between each other.

Above and below outlets 23, there are one of each inlets 24 for the fluid in a liquid phase. The fluid is supplied to the inside of the wick 21 via channels 25, which linearly extend above and below the wick. The fluid enters the wick 21 from the right side of FIG. 5, proceeds to the left, and reaches the outlet 23. Although not shown in the drawing, the wick 21 has a plurality of grooves (extending in the vertical direction) to generate capillary force. For example, on the right half 21R of the wick 21, there are minute grooves with a small pitch, and on the left half 21L of the wick 21, there are grooves with a larger pitch than those on the right half 21R, causing the fluid to reflux by the generated capillary force. The internal structure of the wick is not limited to a particular structure and may take various forms. Therefore, the pitch of the grooves may be changed gradually or in steps along a particular direction.

On the right side of the wick 21, there is an inlet 26 for the fluid. From this inlet 26, the fluid is supplied to the inside of the wick under a reduced pressure atmosphere.

For the liquid phase channel and the vapor phase channel, a plurality of tubes is used.

As indicated by the double-dashed line in FIG. 5, one end of each of the two tubes 27 composing the liquid phase channel is connected to each of the inlets 24 and the other ends are each connected to the joints 20 of the condenser 8.

One end of each of the two tubes 28 composing the vapor phase channel is connected to each of the outlets 23 of the evaporator 7 and the other ends are each connected to the inlets 13u and 13d of the condenser 8.

One end of each of the tubes 27 and 28 are connected to the evaporator 7 by a junction 29.

Similarly to the wicks 21 of the evaporator 7, on the condenser 8, a plurality of wicks 12u and 12d is formed. The wicks 21 of the evaporator 7 and the wicks 12u and 12d of the condenser 8 are connected by a plurality of liquid phase and vapor phase channel systems.

For connecting the evaporator 7 and the condenser 8, piping made of flexible material is suitable. In this embodiment, each of the tubes 27 and 28 are made of flexible resin. Therefore when these are mounted on the heat transport device 4, no stress caused by the piping is applied on to the imaging elements. In other words, after the tips of the imaging element are aligned (or adjusted) with high precision, negative effects on the imaging system caused by displacement may be prevented.

Next, the operation of the heat transport device 4 is described in the following.

The fluid in a liquid phase flows from the condenser 8 to the evaporator 7 via the tubes 27. Then the fluid penetrates throughout the inside of the wick 21 by the capillary force of the minute grooves on the wick 21. The fluid in a liquid phase is evaporated by the heat generated at the imaging element 22.

The evaporated fluid flows into the condenser 8 via the tubes 28. More specifically, the fluid that reached the condenser 8 via the vapor phase channel flows through the channels 14u and 14d and, then, flows through the plurality of radial grooves 12a formed on each of the wicks 12u and 12d. Here, the fluid in a vapor phase releases latent heat and, as a result, undergoes a phase change to return to a liquid phase. The heat from the fluid is radiated to the outside of the case by heat transfer as described above.

The fluid in a liquid phase which flowed through each of the grooves 12a is collected in one area, i.e. in the vicinity of the joints 20, and then sent into the liquid phase channel. The fluid flows towards the wick 21 of the evaporator 7 via each of the tubes 28.

Each of these steps is carried out to repeat the heat transfer cycle inside the heat transport device 4.

The abovementioned heat transport device provides the advantages described in the following.

Since the condenser has small angular dependency relative to gravity, the performance of the device is not greatly affected by its orientation. For example, even if the condenser 8 is tilted relative to the directions of arrows U and D shown in FIG. 7, the flow of the fluid inside the wick 21 is not disrupted. Consequently, heat transport is carried out without reducing its efficiency.

When installing the heat transport device in an electronic apparatus, the degree of freedom of the orientation of the installed heat transport device is increased, and, thus, the device is suitable for heat transport in a three-dimensional position. For example, the angle of installation relative to the direction of gravity may be selected freely; in other words, the acceptable angle of installation becomes wider. As a result, the required level of heat transport efficiency may be acquired.

The orientation of the apparatus during use does not have to be maintained in a particular direction, e.g. horizontally. Therefore, for an apparatus such as an imaging apparatus, whose orientation changes greatly during use, its heat source (imaging element) may be cooled efficiently.

In the composition described above, the condenser 8 was composed of two substrates. The condenser, however, is not limited to this composition and may be composed of multilayer with three or more substrates. In addition, the heat transport device may take various forms wherein, for example, heat radiating means such as heat radiating fins are installed. The present invention may not only be applied to an imaging element but also may be applied to a wide range of devices such as heat radiating mechanisms and cooling mechanisms for central processors (CPU's), graphic chips, and driver IC's.

What is claimed is:

1. A heat transport device comprising:
an evaporator for vaporizing fluid in a liquid phase;
a condenser having a plurality of wicks for generating capillary force for refluxing fluid, each wick including a plurality of grooves;
a liquid phase channel for circulating fluid in a liquid phase, the liquid phase channel connecting with both the evaporator and the condenser; and
a vapor phase channel for circulating fluid in a vapor phase, the vapor phase channel connecting with both the evaporator and the condenser wherein
the wicks formed on the condenser are arranged symmetrically around an axis orthogonal to the direction of gravity, and
the plurality of grooves forming each wick are arranged in a radial pattern centered at a joint of the liquid phase channel.

2. A heat transport device according to claim 1,
wherein the fluid reaching the condenser via the vapor phase channel passes through and condenses at the plurality of grooves composing the wicks, and
wherein the fluid passes through the grooves is collected in one place and then supplied to the evaporator.

3. A heat transport device according to claim 1, wherein the evaporator is in thermal contact with an imaging element, and wherein the condenser is disposed on a case of an imaging apparatus.

4. A heat transport device according to claim 1, wherein the liquid phase channel and the vapor phase channel are composed of flexible material.

5. An electronic apparatus comprising:
an evaporator for evaporating fluid in a liquid phase;
a condenser having wicks for generating capillary force for refluxing the fluid, each wick including a plurality of grooves;
a heat transport mechanism having a liquid phase channel circulating fluid in a liquid phase and a vapor phase channel for circulating fluid in a vapor phase, for radiating heat of or cooling a data processing element, wherein
the wicks of the condenser is symmetrically arranged around an axis orthogonal to the direction of gravity, and
the plurality of grooves forming each wick are arranged in a radial pattern centered at a joint of the liqiuid phase channel;
wherein the evaporator is in thermal contact with the data processing element.

* * * * *